(12) United States Patent (10) Patent No.: US 11,536,790 B2
Yamashita et al. (45) Date of Patent: Dec. 27, 2022

(54) MEDICAL INFORMATION PROCESSING APPARATUS, MEDICAL INFORMATION PROCESSING METHOD, AND STORAGE MEDIUM

(71) Applicant: CANON MEDICAL SYSTEMS CORPORATION, Otawara (JP)

(72) Inventors: Yuichi Yamashita, Ota (JP); Kazuto Nakabayashi, Nasushiobara (JP); Hitoshi Kanazawa, Utsunomiya (JP); Kazuya Okamoto, Saitama (JP); Hiroshi Takai, Nasushiobara (JP); Nobuyuki Konuma, Utsunomiya (JP); Kensuke Shinoda, Otawara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 376 days.

(21) Appl. No.: 16/720,356

(22) Filed: Dec. 19, 2019

(65) Prior Publication Data

US 2020/0200848 A1 Jun. 25, 2020

(30) Foreign Application Priority Data

Dec. 25, 2018 (JP) .............................. JP2018-241806
Dec. 17, 2019 (JP) .............................. JP2019-227602

(51) Int. Cl.
*G01V 3/00* (2006.01)
*G01R 33/56* (2006.01)
(Continued)

(52) U.S. Cl.
CPC .......... *G01R 33/5608* (2013.01); *G06T 5/002* (2013.01); *G06T 5/50* (2013.01);
(Continued)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS

2002/0087063 A1* 7/2002 Lou .................... G01R 33/3621
600/410
2006/0285634 A1* 12/2006 Toth ...................... A61B 6/488
378/16
(Continued)

FOREIGN PATENT DOCUMENTS

CN 101345592 B * 4/2011
CN 104867153 A * 8/2015 ........... G06K 9/6269

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

According to one embodiment, a medical information processing apparatus includes processing circuitry configured to derive an index value with respect to noise included in data associated with magnetic resonance signals collected by each of a plurality of reception coils, adjust a degree to which noise is removed from the data associated with the magnetic resonance signals based on the derived index value, remove noise from the data associated with the magnetic resonance signals based on the adjusted degree, and perform compositing of the data associated with the magnetic resonance signals from which noise has been removed.

20 Claims, 12 Drawing Sheets

(51) Int. Cl.
  *G06T 5/00*    (2006.01)
  *G06T 5/50*    (2006.01)
(52) U.S. Cl.
  CPC ............... *G06T 2207/10088* (2013.01); *G06T 2207/20212* (2013.01)
(58) Field of Classification Search
  USPC ........................................................ 324/309
  See application file for complete search history.

(56) References Cited

U.S. PATENT DOCUMENTS

2010/0305426 A1* 12/2010 Kimura .................. A61B 5/062
                                                           600/411
2016/0097716 A1*  4/2016 Gulati .................. A61B 5/1495
                                                           250/340
2018/0018757 A1   1/2018 Suzuki

* cited by examiner

MEDICAL INFORMATION PROCESSING APPARATUS, MEDICAL INFORMATION PROCESSING METHOD, AND STORAGE MEDIUM

CROSS-REFERENCE TO RELATED APPLICATION

The present application claims priority based on Japanese Patent Application No. 2018-241806, filed on Dec. 25, 2018 and Japanese Patent Application No. 2019-227602, filed on Dec. 17, 2019, the content of which is incorporated herein by reference.

FIELD

Embodiments of the present invention relate to a medical information processing apparatus, a medical information processing method, and a storage medium.

BACKGROUND

A technology for generating an image by obtaining the sum of squares (SoS) of signals acquired from a plurality of reception coils provided in a magnetic resonance imaging (MRI) apparatus and performing denoise processing on the generated image to acquire an image from which a noise component is removed or restricted has been known. For example, a deep neural network can be used for denoise processing.

DETAILED DESCRIPTION

According to one embodiment, a medical information processing apparatus includes processing circuitry configured to derive an index value with respect to noise included in data associated with magnetic resonance signals collected by each of a plurality of reception coils, adjust a degree to which noise is removed from the data associated with the magnetic resonance signals based on the derived index value, remove noise from the data associated with the magnetic resonance signals based on the adjusted degree, and perform compositing of the data associated with the magnetic resonance signals from which noise has been removed.

Hereinafter, embodiments of a medical information processing apparatus, a medical information processing method, and a storage medium will be described in detail with reference to the drawings.

First Embodiment

Figure 1:
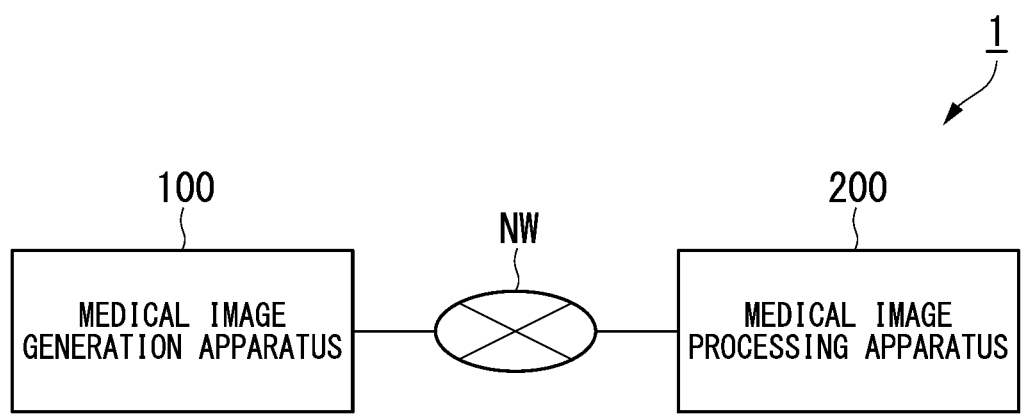
FIG. 1 is a diagram showing an example of a configuration of a medical image processing system 1 including a medical image processing apparatus 200 according to a first embodiment.

FIG. 1 is a diagram showing an example of a configuration of a medical image processing system 1 including a medical image processing apparatus 200 according to a first embodiment. As shown in FIG. 1, the medical image processing system 1 includes, for example, a medical image generation apparatus 100 and the medical image processing apparatus 200. The medical image generation apparatus 100 and the medical image processing apparatus 200 are connected to each other through a network NW. The network NW includes, for example, a wide area network (WAN), a local area network (LAN), the Internet, a dedicated line, a wireless base station, a provider, and the like. The medical image processing apparatus 200 is an example of "a medical information processing apparatus".

The medical image generation apparatus 100 includes, for example, an MRI apparatus. The MRI apparatus applies magnetic fields to a test object (e.g., a human body), for example, receives electromagnetic waves generated from hydrogen nuclei in the test object according to nuclear magnetic resonance using a coil, and reconstructs a signal based on the received electromagnetic waves to generate a medical image (MR image). In the following description, the MRI apparatus will be described as an example of the medical image generation apparatus 100.

The medical image processing apparatus 200 is realized by one or a plurality of processors. For example, the medical image processing apparatus 200 may be a computer included in a cloud computing system or a computer (standalone computer) independently operating without depending on other apparatuses.

[Example of Configuration of Medical Image Generation Apparatus (MRI Apparatus)]

Figure 2:
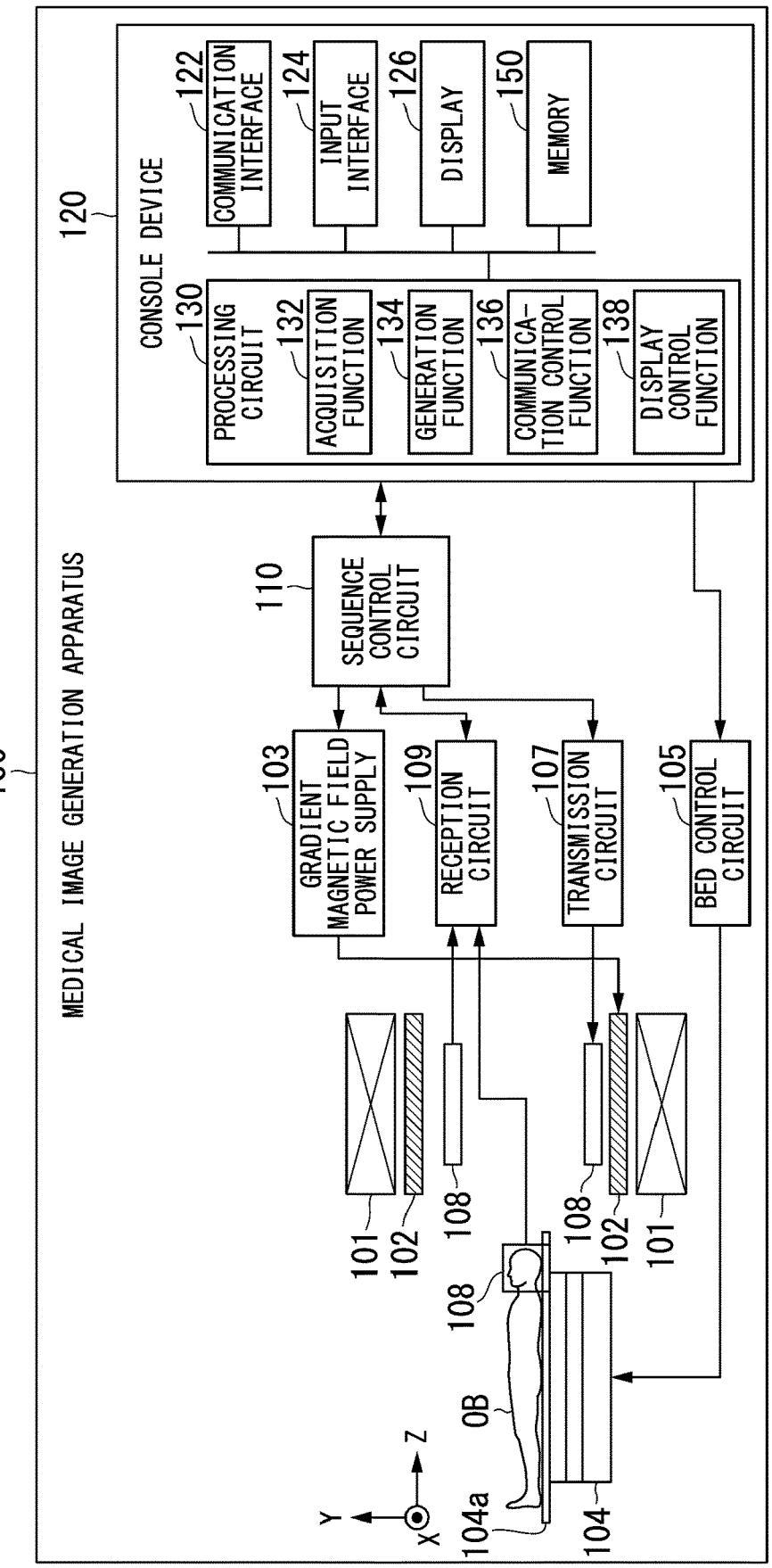
FIG. 2 is a diagram showing an example of a medical image generation apparatus 100 according to the first embodiment.

FIG. 2 is a diagram showing an example of the medical image generation apparatus 100 according to the first embodiment. As shown in FIG. 2, the medical image generation apparatus 100 includes, for example, a static magnetic field magnet 101, a gradient magnetic field coil 102, a gradient magnetic field power supply 103, a bed 104, a bed control circuit 105, a transmission circuit 107, an RF coil 108, a reception circuit 109, a sequence control circuit 110, and a console device 120.

The static magnetic field magnet 101 is a magnet formed in an approximately cylindrical hollow shape. The static magnetic field magnet 101 generates uniform static magnetic fields in the internal space thereof. For example, the static magnetic field magnet 101 may be a permanent magnet, a superconducting magnet, or the like. The gradient magnetic field coil 102 is a coil formed in an approximately cylindrical hollow shape and disposed inside the static magnetic field magnet 101. The gradient magnetic field coil 102 is formed by combining three coils corresponding to x, y and z axes perpendicular to one another. A z-axis direction represents a longitudinal direction of a top board 104a of the bed 104, an x-axis direction represents an axial direction perpendicular to the z-axis direction and parallel to the floor of the room where the medical image generation apparatus 100 is installed, and a y-axis direction represents an axial direction that is a vertical direction with respect to the floor. The three coils associated with the respective axial directions individually receive current from the gradient magnetic field power supply 103 and generate gradient magnetic fields having magnetic field strength varying in accordance with the x, y and z axes. The z-axis direction is defined as the same direction as static magnetic fields.

The gradient magnetic field power supply 103 supplies current to the gradient magnetic field coil 102. Gradient magnetic fields of the x, y and z axes generated by the gradient magnetic field coil 102 respectively correspond to a slice selection gradient magnetic field Gs, a phase encoding gradient magnetic field Ge, and a lead-out gradient magnetic field Gr, for example. The slice selection gradient magnetic field Gs is used to arbitrarily determine a cross section to be imaged. The phase encoding gradient magnetic field Ge is used to change the phase of a magnetic resonance signal depending on a spatial position. The lead-out gradient magnetic field Gr is used to change the frequency of a magnetic resonance signal depending on a spatial position.

The bed 104 includes the top board 104a on which a test object OB is mounted. The top board 104a of the bed 104 on which the test object OB is mounted is inserted into a hollow (imaging hole) of the gradient magnetic field coil 102 under the control of the bed control circuit 105. In general, the bed 104 is installed such that the longitudinal direction thereof is parallel to the central axis of the static magnetic field magnet 101. The bed control circuit 105 drives the bed 104 such that the top board 104a moves in the longitudinal direction and the vertical direction under the control of the console device 120.

The RF coil 108 receives supply of radio frequency (RF) pulses from the transmission circuit 107 and generates high-frequency magnetic fields. The transmission circuit 107 supplies RF pulses associated with a Larmor frequency determined by the type of a nucleus that is a target and a magnetic field strength to the RF coil 108. The RF coil 108 receives a magnetic resonance signal generated from the test object OR object OB according to the influence of high-frequency magnetic fields. The magnetic resonance signal includes, for example, a signal strength component and a phase component. When the RF coil 108 receives the magnetic resonance signal, the RF coil 108 outputs the received magnetic resonance signal to the reception circuit 109.

For example, the RF coil 108 is a coil for a whole body accommodated in the frame of the MRI apparatus and configured to surround the test object OB or a local coil provided for each imaging portion of the test object OB. Although a local coil will be exemplified as the RF coil 108 below, the type of the RF coil 108 is not limited. Transmission and reception may be performed using different RF coils or the RF coil 108 may be configured for both transmission and reception. The RF coil 108 is a coil array including a plurality of coil elements in the first embodiment.

Figure 3:
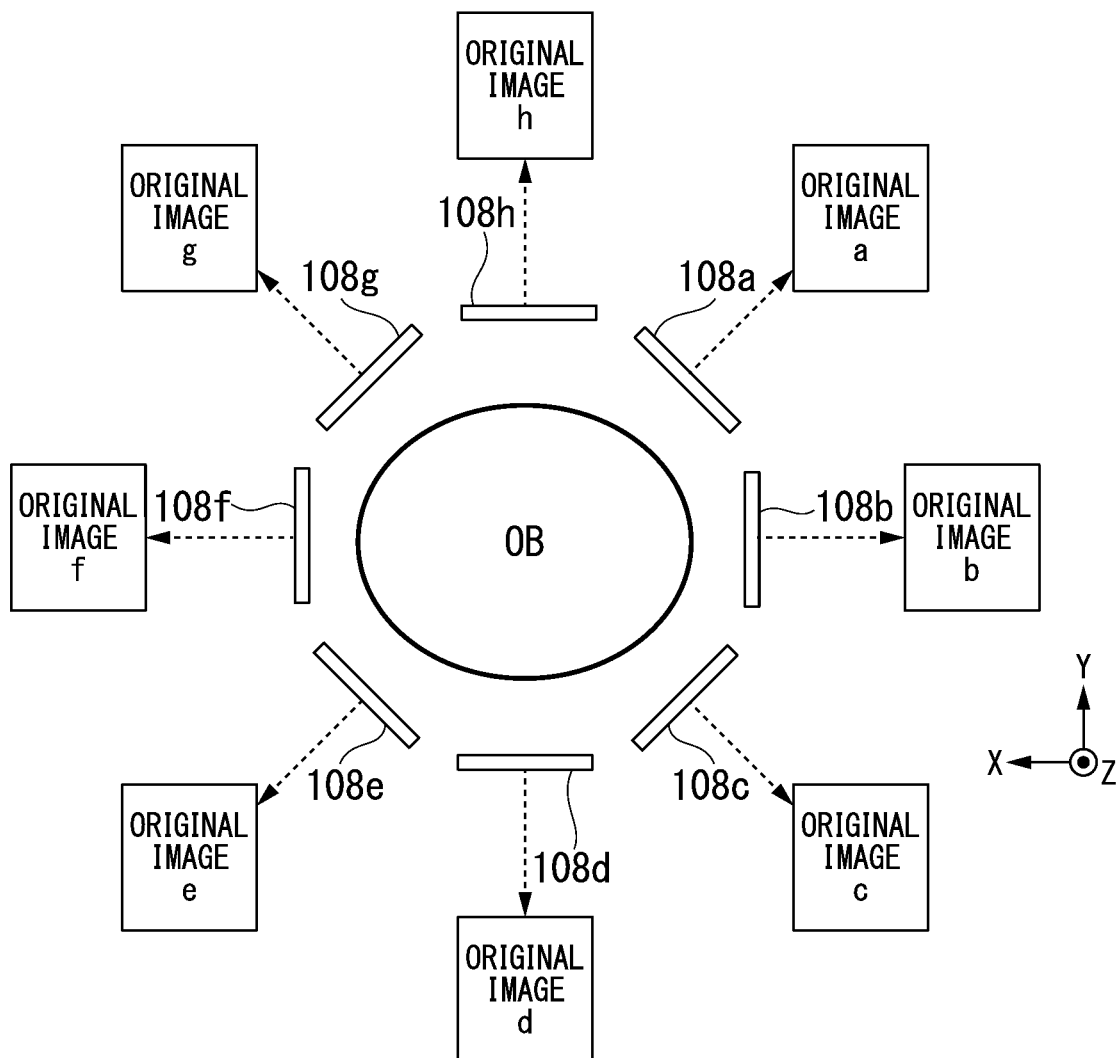
FIG. 3 is a diagram showing an example of arrangement of an RF coil 108 included in the medical image generation apparatus 100 according to the first embodiment.

FIG. 3 is a diagram showing an example of arrangement of the RF coil 108 included in the medical image generation apparatus 100 according to the first embodiment. FIG. 3 shows an example in which the RF coil 108 includes eight coil elements 108a to 108h. These coil elements 108a to 108h are arranged to surround the test object OB along the z axis, for example. Each of the coil elements 108a to 108h receives a magnetic resonance signal generated from the test object OB and outputs the magnetic resonance signal to the reception circuit 109.

The reception circuit 109 generates magnetic resonance data for each of magnetic resonance signals output from the coil elements 108a to 108h. For example, the reception circuit 109 converts the magnetic resonance signals which are analog signals output from the coil elements 108a to 108h into digital signals to generate a set of magnetic resonance data which is a digital signal. The reception circuit 109 transmits the generated set of magnetic resonance data to the sequence control circuit 110. The reception circuit 109 may be provided in a frame apparatus including the static magnetic field magnet 101, the gradient magnetic field coil 102 and the like.

The sequence control circuit 110 images the test object OB by driving the gradient magnetic field power supply 103, the transmission circuit 107 and the reception circuit 109 based on sequence information output from the console device 120. The sequence information defines a procedure for performing imaging processing. The sequence information includes information in which a level of current supplied by the gradient magnetic field power supply 103 to the gradient magnetic field coil 102 and a timing at which the current is supplied, intensity of RF pulses transmitted by the transmission circuit 107 to the RF coil 108 and an RF pulse application timing, a timing at which the reception circuit 109 detects a magnetic resonance signal, and the like are defined.

When the sequence control circuit 110 drives the gradient magnetic field power supply 103, the transmission circuit 107 and the reception circuit 109, receives magnetic resonance data from the reception circuit 109, and forwards the received magnetic resonance data to the console device 120.

The console device 120 controls the entire medical image generation apparatus 100 and collects magnetic resonance data. For example, the console device 120 includes a communication interface 122, an input interface 124, a display 126, a processing circuit 130, and a memory (storage) 150.

The communication interface 122 includes, for example, a communication interface such as a network interface card (NIC). The communication interface 122 communicates with the medical image processing apparatus 200 through the network NW and transmits/receives information to/from the medical image processing apparatus 200. The communication interface 122 outputs received information to the processing circuit 130. The communication interface 122 may transmit information to other devices connected through the network NW under the control of the processing circuit 130.

The input interface 124 is an interface which receives various input operations from an operator. When the input interface 124 receives an input operation, it converts the received input operation into an electric signal and outputs the electric signal to the processing circuit 130. For example, the input interface 124 is realized by a mouse, a keyboard, a trackball, a switch, a button, a joystick, a touch panel or the like. The input interface 124 may be realized by, for example, a user interface which receives audio input such as a microphone. When the input interface 124 is a touch panel, the display 126 which will be described later may be integrated with the input interface 124.

The display 126 displays various types of information. For example, the display 126 displays an image generated by the processing circuit 130 or a graphical user interface (GUI) for receiving various input operations from an operator, and the like. For example, the display 126 includes a liquid crystal display (LCD), a cathode ray tube (CRT) display, an organic electroluminescence (EL) display, or the like.

The processing circuit 130 includes, for example, an acquisition function 132, a generation function 134, a communication control function 136, and a display control function 138. These functions (components) are realized by a processor (or a processor circuit) such as a central processing unit (CPU) or a graphics processing unit (GPU) executing a program (software) stored in the memory 150. Some or all of the functions of the processing circuit 130 may be realized by hardware (circuitry) such as a large scale integration (LSI) circuit, an application specific integrated circuit (ASIC) and a field-programmable gate array (FPGA) or software and hardware in cooperation. The aforementioned program may be stored in the memory 150 in advance or stored in a detachable storage medium such as a DVD or a CD-ROM and installed in the memory 150 from the storage medium by mounting the storage medium in a drive device of the console device 120.

The memory 150 is realized by a semiconductor memory element such as a random access memory (RAM) or a flash memory, a hard disk, an optical disc, or the like. These non-transitory storage medium may be realized by other storage devices connected through the network NW, such as a network attached storage (NAS) and an external storage server device. These non-transitory storage medium may be realized by a storage device such as a read only memory (ROM) or a register.

The acquisition function 132 acquires magnetic resonance data from the sequence control circuit 110. The magnetic resonance data is obtained by digitalizing electromagnetic wave signals (magnetic resonance signals) generated in the test object OB according to nuclear magnetic resonance, as described above. Magnetic resonance data two-dimensionally or three-dimensionally arranged, for example, in accordance with information provided by the above-described slice selection gradient magnetic field Gs, the phase encoding gradient magnetic field Ge and the lead-out gradient magnetic field Gr may also be referred to as k-space data.

The generation function 134 performs reconstruction processing including processing such as a Fourier transform (e.g., an inverse Fourier transform) on k-space data acquired by the acquisition function 132 to generate an MR image reconstructed from the k-space data. The generation function 134 performs reconstruction processing including processing such as a Fourier transform (e.g., an inverse Fourier transform) on magnetic resonance data of respective magnetic resonance signals output from the coil elements 108$a$ to 108$h$ to generate a set of MR images (hereinafter, original images) for the respective magnetic resonance signals output from the coil elements 108$a$ to 108$h$. As shown in FIG. 3, the generation function 134 generates original images a to h as a set of original images of magnetic resonance signals output from the coil elements 108$a$ to 108$h$.

When the original images a to h are reconstructed by the generation function 134, the communication control function 136 causes the communication interface 122 to communicate with the medical image processing apparatus 200 to transmit the reconstructed original images a to h to the medical image processing apparatus 200 that is a communication partner. The communication control function 136 may cause the communication interface 122 to communicate with the medical image processing apparatus 200 to receive various types of information from the medical image processing apparatus 200 that is the communication partner.

The display control function 138 causes the display 126 to display medical images received from the medical image processing apparatus 200. The display control function 138 may cause the display 126 to display the original images a to h generated by the generation function 134.

[Example of Configuration of Medical Image Processing Apparatus]

Figure 4:
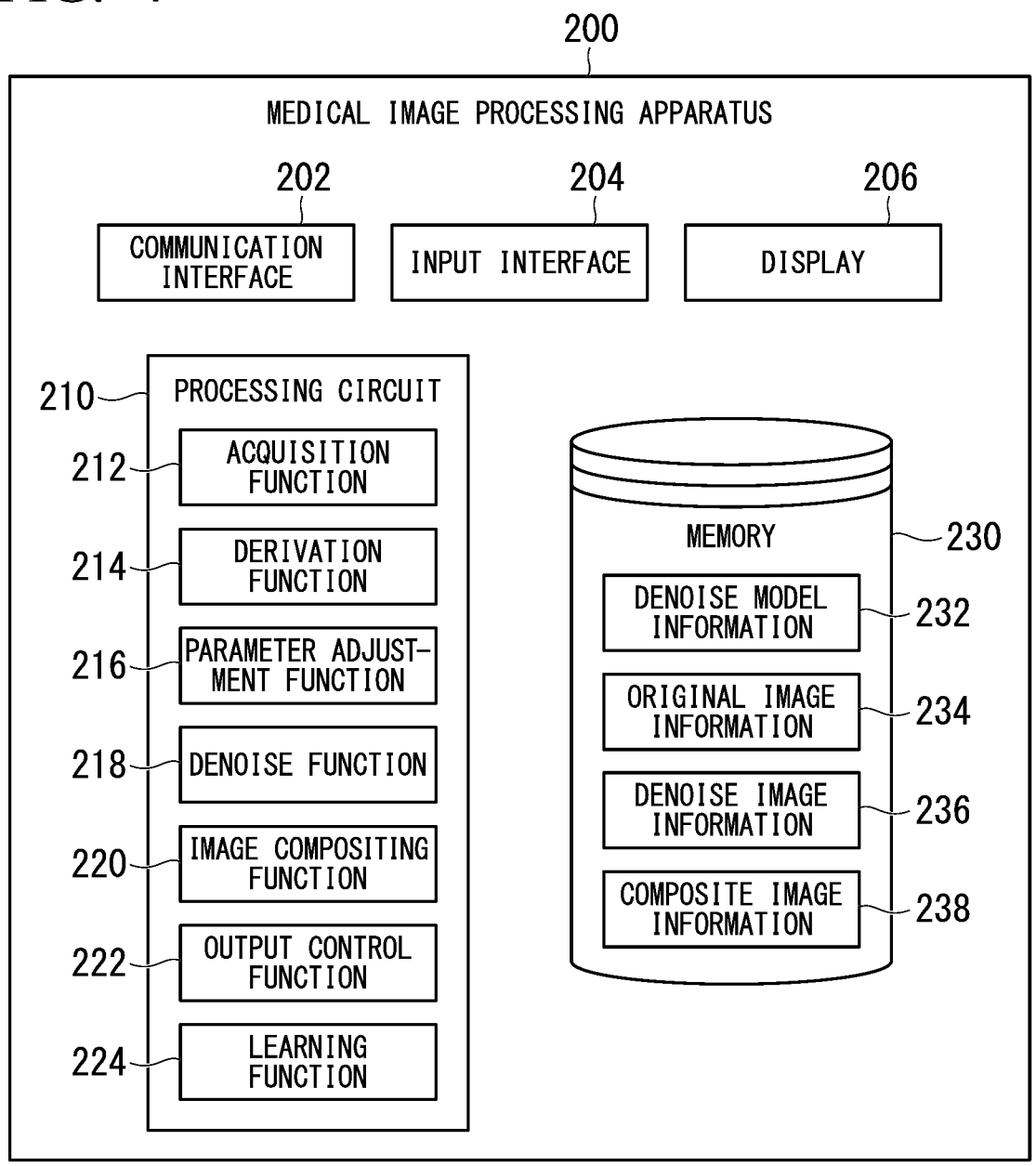
FIG. 4 is a diagram showing an example of the medical image processing apparatus 200 according to the first embodiment.

FIG. 4 is a diagram showing an example of the medical image processing apparatus 200 according to the first embodiment. The medical image processing apparatus 200 generates a final image (hereinafter, a composite image) by performing denoise processing for removing or reducing noise on the original images a to h received from the medical image generation apparatus 100 and combining the images on which denoise processing has been performed. Hereinafter, removal or reduction of noise will be simply described as removal of noise. As shown in FIG. 4, the medical image processing apparatus 200 includes, for example, a communication interface 202, an input interface 204, a display 206, a processing circuit 210, and a memory 230.

The communication interface 202 includes, for example, a communication interface such as an NIC. For example, the communication interface 202 communicates with the medical image generation apparatus 100 through the network NW and receives a reconstructed medical image from the medical image generation apparatus 100. The communication interface 202 outputs the received medical image to the processing circuit 210. The communication interface 202 may transmit information to the medical image generation apparatus 100 or other devices connected through the network NW under the control of the processing circuit 210. The other devices may be, for example, terminal devices which can be used by image readers such as doctors and nurses.

The input interface 204 receives various input operations from an operator, converts the received input operations into electrical signals and outputs the electrical signals to the processing circuit 210. For example, the input interface 204 is realized by a mouse, a keyboard, a track ball, a switch, a button, a joystick, a touch panel, or the like. The input interface 204 may be realized by a user interface that receives audio input such as a microphone, for example. When the input interface 204 is a touch panel, the display 206 which will be described later may be integrated with the input interface 204.

The display 206 displays various types of information. For example, the display 206 displays an image (a denoise image or a composite image which will be described later) generated by the processing circuit 210, a GUI for receiving various input operations from an operator, and the like. For example, the display 206 is an LCD, a CRT display, an organic EL display, or the like.

The processing circuit 210 may execute an acquisition function 212, a derivation function 214, a parameter adjustment function 216, a denoise function 218, an image compositing function 220, an output control function 222, and a learning function 224, for example. The derivation function 214 is an example of a "derivator," the parameter adjustment function 216 is an example of an "adjuster," the denoise function 218 is an example of a "remover" and the image compositing function 220 is an example of a "compositor."

These functions (components) are realized by a processor (or a processor circuit) such as a CPU or a GPU executing a program (software) stored in the memory 230. Some or all of these functions may be realized by hardware (circuitry) such as an LSI circuit, an ASIC and an FPGA or software and hardware in cooperation. The aforementioned program may be stored in the memory 230 in advance or stored in a detachable storage medium such as a DVD or a CD-ROM and installed in the memory 230 from the storage medium by mounting the storage medium in a drive device of the medical image processing apparatus 200.

The memory 230 is realized by a semiconductor memory element such as a RAM or a flash memory, a hard disk, an optical disc, or the like. These non-transitory storage medium may be realized by other storage devices connected through the network NW, such as an NAS and an external storage server device. These non-transitory storage medium may include a storage device such as a ROM or a register. For example, denoise model information 232, information on original images (hereinafter, original image information 234), information on denoise images (hereinafter, denoise image information 236), information on a composite image (hereinafter, composite image information 238) and the like may be stored in the memory 230.

The denoise model information 232 is information (a program or data structure) in which a denoise model MDL1 which will be described later is defined. The denoise model MDL1 is a model trained to output an image obtained by removing noise from a certain image when the certain image is input. The denoise model MLD1 includes, for example, one or more deep neural networks (DNNs).

For example, the denoise model information 232 includes combination information representing how neurons (units or nodes) included in an input layer, one or more hidden layers (middle layers) and an output layer constituting each DNN included in the denoise model MDL1 are combined, weight information representing the number of combination coefficients assigned to data input and output between combined neurons, and the like. For example, the combination information includes information designating the number of neurons included in each layer or the type of a neuron that is a combination destination of each neuron, and information on an activation function that realizes each neuron, and gates provided between neurons of the hidden layers, or the like. The activation function that realizes a neuron may be a function (a rectified linear unit (ReLU) function, an exponential linear unit (ELU) function or a clipping function) that switches between operations in response to input code, a Sigmoid function, a step function, or a hyperbolic tangent function, or an identity function, for example. A gate selectively passes or weights data transferred between neurons in response to a value (e.g., 1 or 0) returned according to the activation function, for example. The combination coefficient includes a weight assigned to output data when the data is output from a neuron of a certain layer to a neuron of a deeper layer in a hidden layer of a neural network, for example. The combination coefficient may include a unique bias component of each layer, and the like.

For example, the denoise model MDL1 may be realized by a convolutional neural network (CNN). The CNN may have a configuration in which a convolutional layer, an activation layer and the like are arranged in multiple layers.

Figure 5:
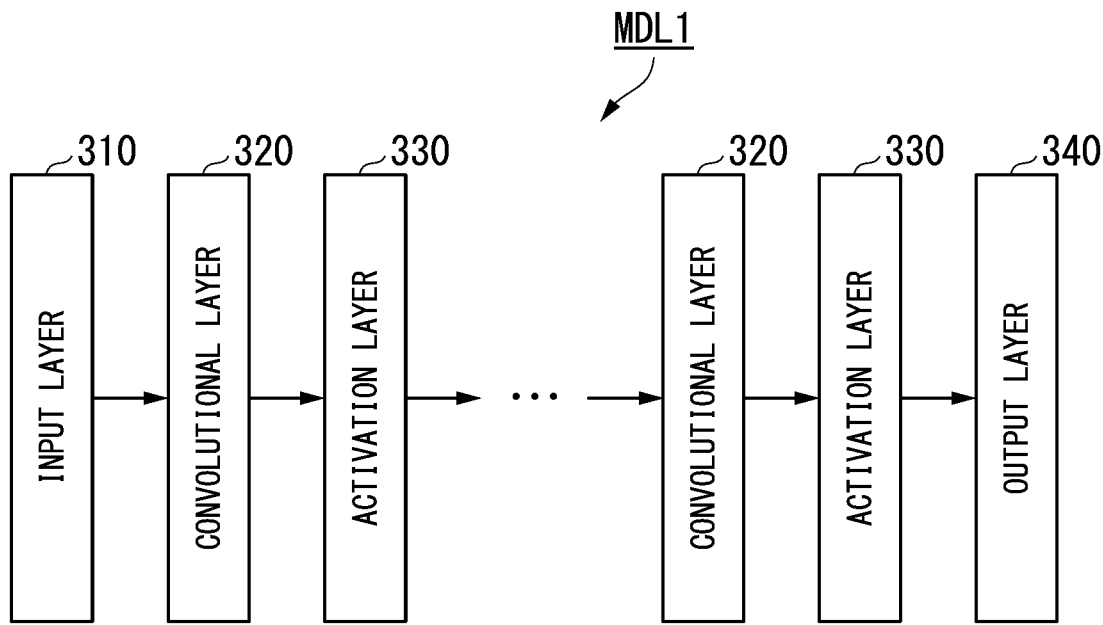
FIG. 5 is a diagram showing an example of a configuration of a denoise model MDL1 according to the first embodiment.

FIG. 5 is a diagram showing an example of a configuration of the denoise model MDL1. As shown in FIG. 5, the denoise model MDL1 may include, for example, an input layer 310, one or more convolutional layers 320, one or more activation layers 330, and an output layer 340.

For example, when an original image is regarded as a matrix having elements associated with respective pixels, the matrix associated with the original image is input to the input layer 310. The input layer 310 applies a bias component to the input matrix at a suitable time and outputs the input matrix to which the bias component has been applied to the convolutional layer 320 at the following stage.

The convolutional layer 320 repeats a product-sum operation on the input matrix while sliding a linear transformation matrix called a filter or a kernel by a certain determined slide amount to generate a matrix including a plurality of elements with which product sums with the linear transformation matrix are associated as element values from the input matrix. The convolutional layer 320 may perform padding (e.g., zero padding) in which an element having any value around the input matrix is interpolated to convert the matrix input to the convolutional layer 320 to a matrix having the same numbers of rows and columns as the matrix of the original image input to the input layer 310. Then, the convolutional layer 320 outputs the generated matrix to the activation layer 330.

The activation layer 330 performs calculation of an activation function on each element of the matrix input from the convolutional layer 320 and outputs the matrix on which the calculation has been performed to the layer at the following stage.

Figure 6:
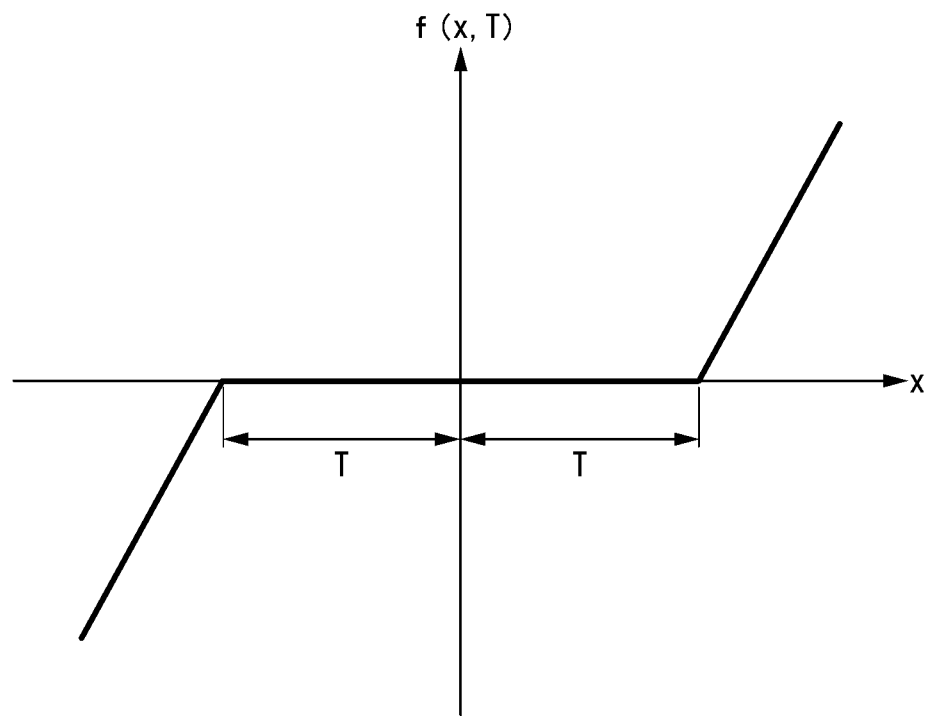
FIG. 6 is a diagram showing an example of an activation function of an activation layer 330 according to the first embodiment.

FIG. 6 is a diagram representing an example of the activation function of the activation layer 330. As shown in FIG. 6, the activation function of the activation layer 330 may be a Soft-Shrinkage function. The Soft-Shrinkage function is represented by mathematical expression (1) below, for example. The activation function of the activation layer 330 may be a Hard-Shrinkage function instead of the Soft-Shrinkage function.

[Math. 1]

$$f(x, T) = \begin{cases} x - T & (x > T) \\ x + T & (x < -T), T \geq 0 \\ 0 & \text{otherwise} \end{cases} \quad (1)$$

The Soft-Shrinkage function or the Hard-Shrinkage function outputs 0 when an element value x that is an input value is within a range of a predetermined positive and negative threshold values ±T having 0 as the center and outputs a value proportional to the element value x when the element value x that is an input value exceeds the positive threshold value +T or when the element value x is less than the negative threshold value −T. It is possible to make an image signal having an amplitude less than the threshold value T, that is, a weak image signal that is noise highly probable to be zero at the output of the activation function, by applying the Soft-Shrinkage function or the Hard-Shrinkage function to the activation function of the activation layer 330.

The threshold value T is a parameter varying according to a noise level (signal strength or signal power) included in an input image and is represented by mathematical expression (2) below, for example.

[Math. 2]

$$T = \alpha \times G \quad (2)$$

G in mathematical expression (2) represents a noise level included in an input image and is a signal which controls a value of the threshold value T (hereinafter, a control signal). The control signal G increases as the noise level included in the input image increases and decreases as the noise level included in the input image decreases. The noise level included in the input image may be determined by the value of a signal-noise ratio (SNR) of the input image.

In mathematical expression (2), α is a weighting factor by which a noise level is multiplied. The weighting factor α is determined by machine learning. As represented by mathematical expression (2), it is possible to make the activation function of the activation layer 330 to be an activation function reacting on signals equal to or greater than a specific strength by varying the threshold value T. As a result, it is possible to remove noise from an original image with high accuracy even if a signal strength of noise included in the original image varies.

The output layer 340 outputs the matrix processed by the convolutional layer 320 and the activation layer 330 at the previous stage.

The denoise model MDL1 exemplified in FIG. 5 is merely an example and, for example, a pooling layer or the like may be included. The pooling layer compresses (reduces) the number of dimensions of an input matrix by replacing element values of the matrix with a representative value such as an average value or a maximum value of all of the element values included in the matrix. The pooling layer outputs the matrix having a compressed number of dimensions to the layer at the following stage.

The acquisition function 212 causes the communication interface 202 to communicate with the medical image generation apparatus 100 to acquire the reconstructed original images a to h from the medical image generation apparatus 100 that is the communication partner. The acquisition function 212 stores the acquired original images a to h in the memory 230 as original image information 234.

The derivation function 214 derives an index value with respect to noise included in each of the original images a to h based on the original images a to h acquired by the acquisition function 212. That is, the derivation function 214 derives an index value with respect to noise included in a plurality of images based on magnetic resonance signals collected from the test object OB through a plurality of reception coils for each image. For example, the derivation function 214 derives an SNR as an index value with respect to noise. An SNR is an index value obtained by dividing a signal strength of an image by a signal strength of noise. A method of deriving an SNR will be described in detail later. The derivation function 214 may derive data related to an SNR, such as signal strengths of the original images a to h, noise levels, a gain during normalization processing, and the like. The derivation function 214 may derive an index value with respect to noise included in each of the original images a to h based on supplementary information of the original images a to h.

The parameter adjustment function 216 adjusts a control function G that is an internal parameter of the denoise model MDL1 based on an SNR derived by the derivation function 214. That is, the parameter adjustment function 216 adjusts a degree to which noise is removed from the respective original images a to h based on the SNR that is an index value derived by the derivation function 214. The parameter adjustment function 216 increases the degree as the signal-noise ratio decreases and decreases the degree as the signal-noise ratio increases. The parameter adjustment function 216 inputs the adjusted control function G to at least one node of the activation layer 330.

The parameter adjustment function 216 may determine one degree to which noise is removed (one denoise strength) with respect to a plurality of original images a to h. That is, the determined one degree is applicable to all of the plurality of original images a to h. In this case, the derivation function 214 derives noise of data obtained by performing imaging under a condition that the test object OB is mounted on the top board 104a and an RF pulse is not applied. For example, the derivation function 214 quantifies a distribution of Gaussian noise in image space reconstructed from k-space data which has been collected under a condition that an RF pulse is not applied. The parameter adjustment function 216 may determine the one degree to which noise is removed in accordance with the noise quantified in this way. Since there are some cases in which the strength or distribution of noise changes in accordance with an imaging condition, the degree to which noise is removed may be adjusted for each time when the imaging condition is changed.

Figure 7:
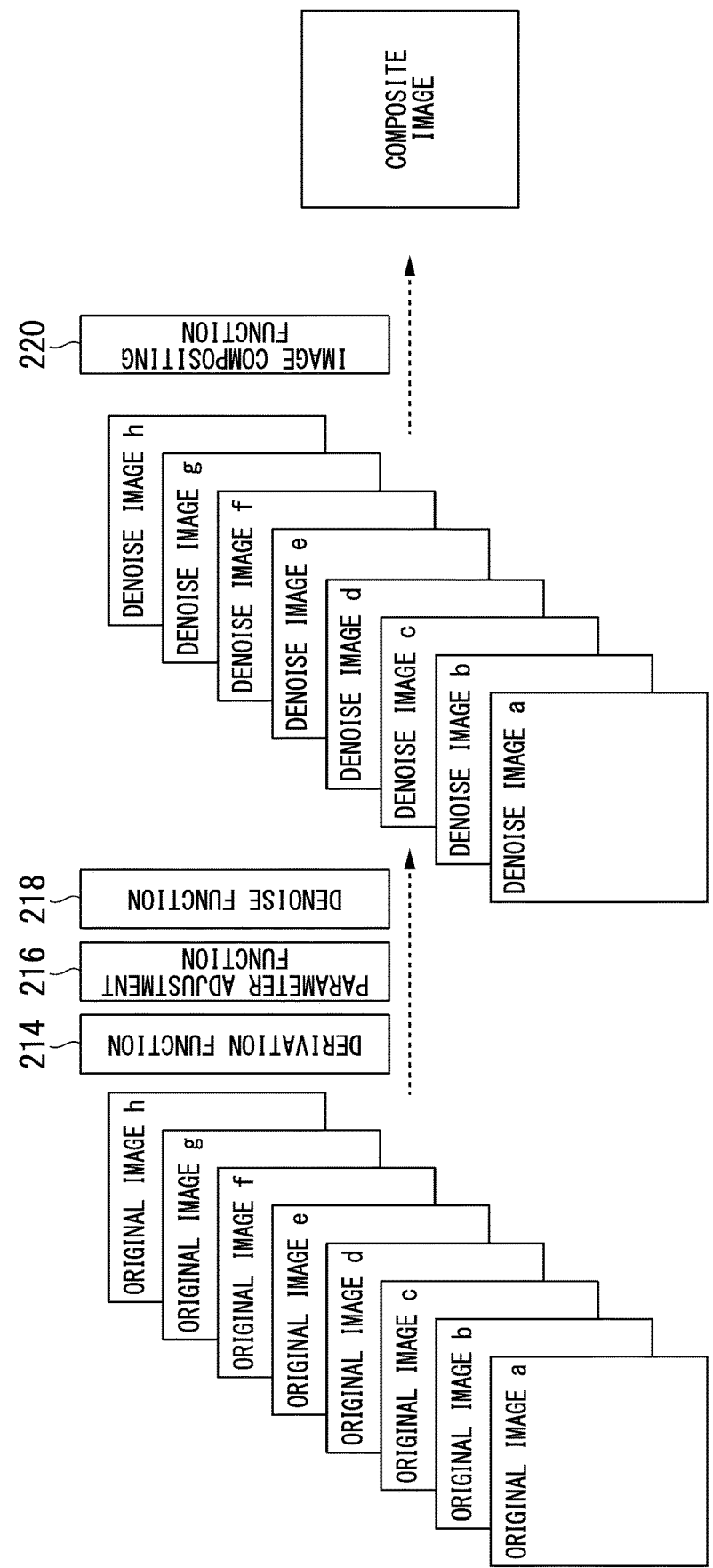
FIG. 7 is a diagram showing an example of a configuration in which denoise images and a composite image are generated from original images according to the first embodiment.

The denoise function 218 generates a plurality of images (hereinafter, denoise images) obtained by removing noise from each of the original images a to h acquired by the acquisition function 212 using the denoise model MDL1 indicated by the denoise model information 232. FIG. 7 is a diagram showing an example of a configuration in which denoise images and a composite image are generated from original images according to the first embodiment. As shown in FIG. 7, the denoise function 218 removes noise from the original images a to h acquired by the acquisition function 212 to generate denoise images a to h. That is, the denoise function 218 acquires the matrix output from the output layer 340 of the denoise model MDL1 as the denoise images a to h obtained by removing noise from the original images a to h. The denoise function 218 stores the generated denoise images a to h in the memory 230 as the denoise image information 236.

When the denoise images a to h are generated, the denoise function 218 can adjust values of internal parameters set in the denoise model MDL1 based on the parameter adjusted by the parameter adjustment function 216. That is, the denoise function 218 can cause a denoise degree of each original image to be variable through the control function G adjusted based on SNRs of the original images a to h. The denoise model MDL1 may be realized as a part of the denoise function 218 by a processor executing the denoise model MDL1, for example. The denoise function 218 removes noise from the data associated with the magnetic resonance signals based on a model trained to output data obtained by removing noise from the data associated with the magnetic resonance signals when the data associated with the magnetic resonance signals is input.

The denoise function 218 is not limited to a function using a neural network. The denoise function 218 may remove or reduce noise using a model generated by any machine learning such as logistic regression analysis, decision tree analysis, or a technique based on support-vector machine, for example. The denoise function 218 may remove or reduce noise through wavelet transformation for original images.

The denoise function 218 is not limited to a function using a machine learning technique. The denoise function 218 may perform denoise processing by, for example, statistically analyzing an image signal and restoring, from the image signal including noise, a signal from which noise is removed, based on sparsity of signal when the image signal is projected to a noise removal space. The denoise function 218 may perform denoise processing using any filtering technique. The denoise function 218 may perform denoise processing by averaging image signals or extracting amount of characteristic in an image signal.

The image compositing function 220 generates a composite image through compositing of the denoise images a to h generated by the denoise function 218. The image compositing function 220 may generate the composite image using a compositing algorithm using a square sum root, or the like, for example. As shown in FIG. 7, the image compositing function 220 generates a single composite image through compositing of the plurality of denoise images a to h. This composite image becomes a final captured image of the medical image generation apparatus 100. When the medical image generation apparatus 100 is an apparatus which reconstructs an MR image through parallel imaging, the image compositing function 220 may perform processing of spreading folding of an image, or the like in reconstruction processing based on the denoise images a to h. The image compositing function 220 stores the generated composite image in the memory 230 as composite image information 238.

When the image compositing function 220 generates the composite image, the output control function 222 causes the communication interface 202 to communicate with the medical image generation apparatus 100 to transmit the composite image to the medical image generation apparatus 100 that is the communication partner. The output control function 222 may cause the display 206 to display the composite image.

The learning function 224 inputs images regarded as certain data for learning (hereinafter, learning images) to the denoise model MDL1 and learns the denoise model MLD1 such that denoise images output from the denoise model MDL1 approach an image which is training data (hereinafter, training image). For example, the training image may be an image having an SNR that has increased by increasing a sampling frequency or the like. The learning images may be images to which known noise has been applied to the training image. The known noise may be Gaussian noise, for example.

For example, the learning function 224 learns various parameters such as element values of a linear transformation matrix of the convolutional layer 320 and the weighting factor α of the activation function of each node of the activation layer 330 using a gradient method such as stochastic gradient descent (SGD), momentum SGD, AdaGrad, RMSprop, AdaDelta or adaptive moment estimation (Adam) such that differences between denoise images output from the denoise model MDL1 and the training image decrease.

In the above, the example in which each function of the processing circuit 210 generates the composite image by performing the denoise processing with respect to the original images a to h received from the medical image generation apparatus 100 and performing of compositing of the images after the denoise processing is described, but the present invention is not limited thereto. For example, each function of the processing circuit 210 may generates a composite image by performing denoise processing with respect to data before reconstruction such as k-space data received from the medical image generation apparatus 100 (data associated with magnetic resonance signals output from the coil elements 108a to 108h), and performing compositing of the images after the denoise processing.

That is, the derivation function 214 derives an index value with respect to noise included in data associated with magnetic resonance signals collected by each of a plurality of reception coils. The parameter adjustment function 216 adjusts the degree to which noise is removed from the data associated with magnetic resonance signals based on the index value derived by the derivation function 214. The denoise function 218 removes noise from the data associated with magnetic resonance signals based on the degree adjusted by the parameter adjustment function 216. The image compositing function 220 performs composition of the data which is associated with magnetic resonance signals collected by each of a plurality of reception coils and from which noise is removed by the denoise function 218. The data associated with magnetic resonance signals includes data of a plurality of images based on the magnetic resonance signals.

[Processing flow (learning processing)]

Figure 8:
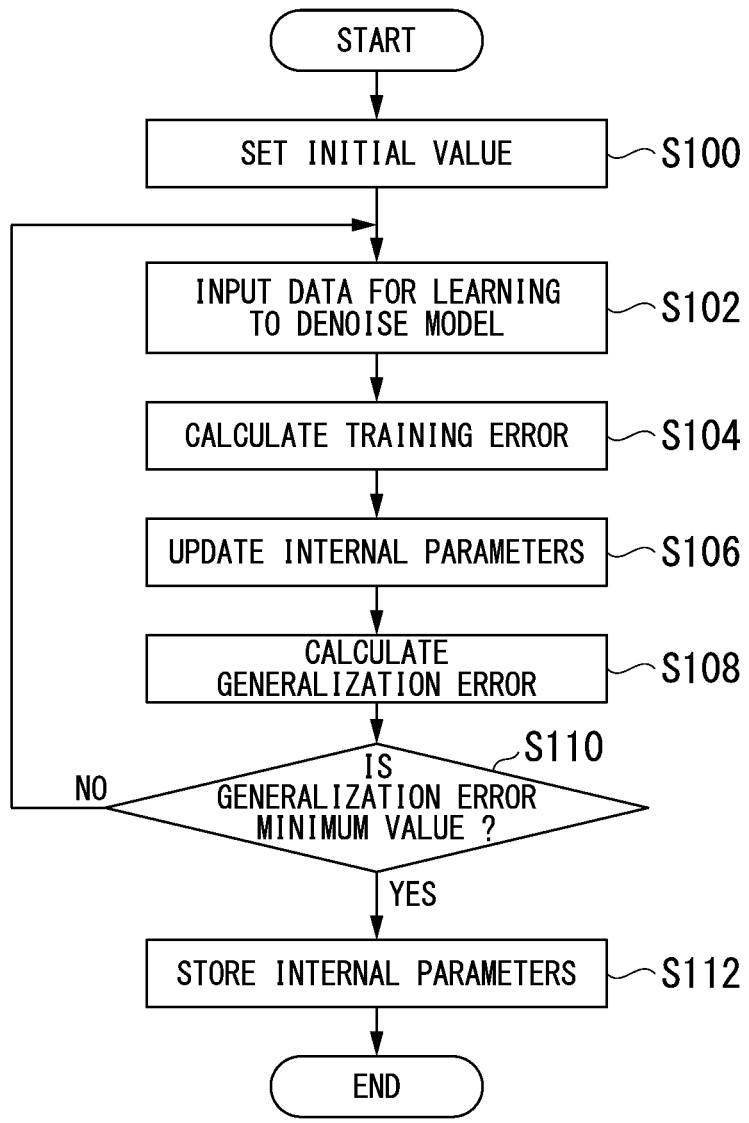
FIG. 8 is a flowchart showing a series of learning processing of a processing circuit 210 in the first embodiment.

Hereinafter, a processing flow of the processing circuit 210 in the first embodiment will be described. Processing of the processing circuit 210 includes learning processing of learning the denoise model MDL1 and image processing of removing noise using the trained denoise model MDL1. In the following, learning processing of the processing circuit 210 will be described first. FIG. 8 is a flowchart showing a series of learning processing of the processing circuit 210 in the first embodiment. Processing of this flowchart is performed, for example, when an operator of the medical image processing apparatus 200 operates the input interface 204 to instruct leaning processing to start.

First, the learning function 224 sets various parameters such as the control signal G for the denoise model MDL1 and the weighting factor α of the activation function of each node of the activation layer 330 to initial values (step S100). For example, the control signal G and the weighting factor α are set to 1.

Next, the learning function 224 inputs learning images to the denoise model MDL1 and acquires the processing result (step S102). For example, the learning images are images obtained by adding known noise to training images which are images including no noise or images having high SNRs. The learning images are acquired, for example, by adding the noise to pixel values of a training image.

For example, the learning function 224 inputs pixel values of pixels of the learning images to each input terminal of the input layer of the denoise model MDL1. These pixel values are propagated through nodes of middle layers of the denoise model MDL1 from the input layer to the output layer while varying values through weighted addition, bias addition and activation function processing operation. Then, pixel values of an image processed by the denoise model MDL1 (hereinafter, processing result image) are output to the output terminal of the output layer as a processing result.

Next, the learning function 224 calculates a training error that is an error between the processing result image and the training image (step S104). The training error is a mean square error of each pixel of the processing result image and the training image, a square error of each pixel, for example.

Next, the learning function 224 updates the internal parameters of the denoise model MDL1, for example, using error back propagation such that the calculated training error decreases (step S106). Next, the learning function 224 calculates, using a correct image that is an image including no noise or an image having a high SNR prepared separately from the training image and a verification image obtained by adding noise to the correct image, a generalization error that is an error between a processing result image when the verification image is input to the denoise model MDL1 and the correct image (step S108). Next, the learning function 224 determines whether the generalization error reaches a minimum value (step S110).

When it is determined that the generalization error does not reach the minimum value, the learning function 224 repeats processing after step S102 again. On the other hand, when it is determined that the generalization error reaches the minimum value, the learning function 224 stores the internal parameters of the denoise model MDL1 after learning in the memory 230 (step S112). Accordingly, processing of this flowchart ends.

[Processing Flow (Image Processing)]

Figure 9:
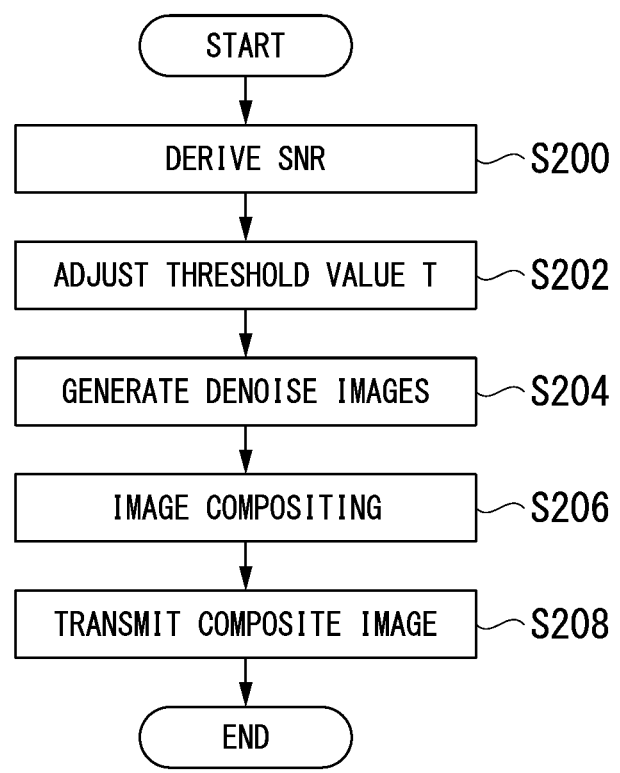
FIG. 9 is a flowchart showing a series of image processing of the processing circuit 210 in the first embodiment.

Next, image processing of the processing circuit 210 will be described. FIG. 9 is a flowchart showing a series of image processing of the processing circuit 210 in the first embodiment. Processing of this flowchart is performed, for example, when the original images a to h transmitted from the medical image generation apparatus 100 are acquired by the acquisition function 212.

First, the derivation function 214 derives SNRs of the original images a to h acquired by the acquisition function 212 (step S200). For example, the derivation function 214 supplies RF pulses to the RF coil 108 in a state in which the gradient magnetic field coil 102 has generated gradient magnetic fields with respect to the original images a to h acquired by the acquisition function 212 and derives SNRs based on pixel value differences between original images (hereinafter referred to as original images with RF pulses) acquired when high-frequency magnetic fields have been output and original images (hereinafter referred to as original images without RF pulses) acquired without output of high-frequency magnetic fields in a state in which the gradient magnetic field coil 102 has generated gradient magnetic fields.

The derivation function 214 may derive SNRs of the original images based on differences between pixel values of two or more original images with RF pulses acquired when high-frequency magnetic fields have been output to the same test object OB with respect to the original images a to h acquired by the acquisition function 212. Here, the derivation function 214 may derive SNRs of the original images based on differences between pixel values of two original images with RF pulses close to a center slice. For example, when the present scan is a sequence in which a scan is repeated 10 times, the center slice is an original image acquired through a fifth or sixth scan.

In this manner, magnetic resonance signal components can be canceled each other and SNRs can be obtained based on random noise components caused by thermal noise of a reception system by obtaining differences between two original images acquired by performing scanning a plurality of times under the condition of the same test object OB.

Next, the parameter adjustment function 216 adjusts a value of the threshold value T that is an internal parameter of the denoise model MDL1 by determining the control function G based on the SNRs derived by the derivation function 214 with respect to the original images a to h and inputting the adjusted control function G to at least one node of the activation layer 330 of the denoise model MDL1 (step S202).

Next, the denoise function 218 removes noise using the denoise model MDL1 in which the threshold value T adjusted by the parameter adjustment function 216 is set as an internal parameter with respect to the original images a to h to generate the denoise images a to h (step S204).

Next, the image compositing function 220 generates a composite image that is a final captured image through compositing of the denoise images a to h generated by the denoise function 218 (step S206).

Next, the output control function 222 controls the communication interface 202 to transmit the composite image generated by the image compositing function 220 to the medical image generation apparatus 100 (step S208). The output control function 222 may cause the display 206 to display the composite image. When the communication interface 122 of the medical image generation apparatus 100 receives the composite image from the medical image processing apparatus 200, the display control function 138 of the medical image generation apparatus 100 may cause the display 126 to display the composite image. The output control function 222 may control the communication interface 202 such that the composite image is transmitted to a terminal device that can be used by an image reader.

According to the above-described first embodiment, it is possible to prevent a decrease in the accuracy of denoise processing caused by noise distribution differences between the original images a to h by performing denoise processing on the original images a to h based on magnetic resonance signals output from the coil elements 108a to 108h and generating a composite image through compositing of denoise images from which noise has been removed. It is possible to cause a degree to which noise is removed to be variable according to the amount of noise included in each of the original images a to h in denoise processing of the present embodiment. This denoise processing does not affect signal components other than noise. Accordingly, it is possible to improve the accuracy of denoise processing and maintain the quality of a finally acquired image.

Modified Example of First Embodiment

Hereinafter, a modified example of the first embodiment will be described. Although the medical image generation apparatus 100 and the medical image processing apparatus 200 are different apparatuses in the above-described first embodiment, the present invention is not limited thereto. For example, the medical image processing apparatus 200 may be realized by a function of the console device 120 of the medical image generation apparatus 100. That is, the medical image processing apparatus 200 may be a virtual machine virtually realized by the console device 120 of the medical image generation apparatus 100. In this case, the medical image generation apparatus 100 is an example of a "medical information processing apparatus."

Figure 10:
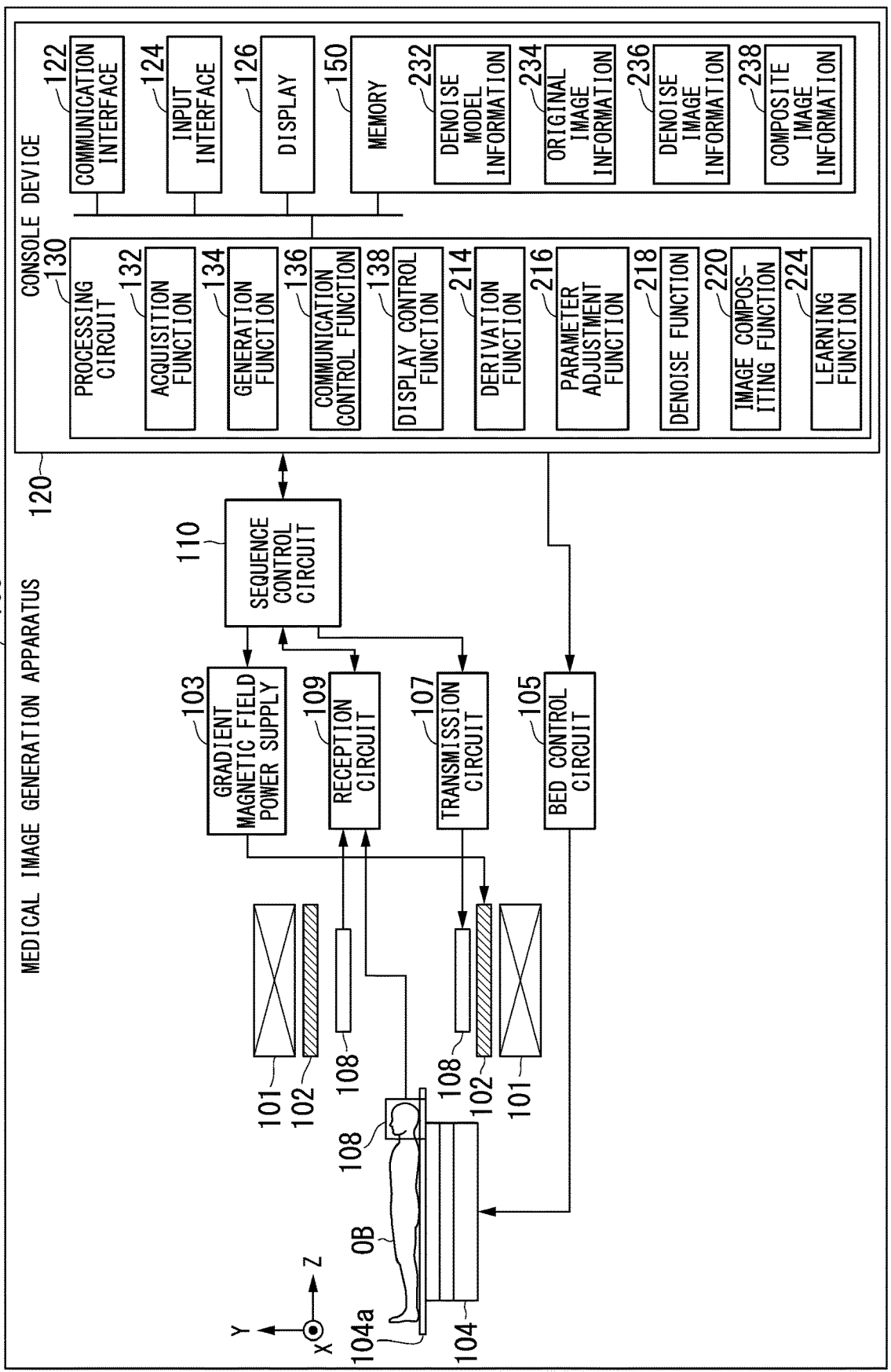
FIG. 10 is a diagram showing an example of a medical image generation apparatus 100 according to a modified example of the first embodiment.

FIG. 10 is a diagram showing a medical image generation apparatus 100 according to the modified example of the first embodiment. As shown in FIG. 10, the processing circuit 130 of the console device 120 may execute the derivation function 214, the parameter adjustment function 216, the denoise function 218, the image compositing function 220 and the learning function 224 in addition to the above-described acquisition function 132, generation function 134, communication control function 136 and display control function 138. The denoise model information 232, the original image information 234, the denoise image information 236 and the composite image information 238 may be stored in the memory 150 of the console device 120.

According to the above-described modified example of the first embodiment, it is possible to improve the accuracy of denoise processing using only the medical image generation apparatus 100.

Second Embodiment

Hereinafter, a second embodiment will be described. In the above-described first embodiment, a configuration in which denoise processing is performed on the respective original images a to h based on magnetic resonance signals output from the plurality of coil elements 108a to 108h and compositing of denoise images from which noise has been removed is performed has been described. In the present embodiment, the processing circuit 210 of the medical image processing apparatus 200 performs processing of adding a noise component for uniformizing a noise strength distribution to a composite image generated through compositing of original images without performing denoise processing and performs denoise processing on the processed composite image. Accordingly, the figures described in the first embodiment and related description are used to describe a configuration and the like and detailed description thereof is omitted.

[Example of Configuration of Medical Image Processing Apparatus]

Figure 11:
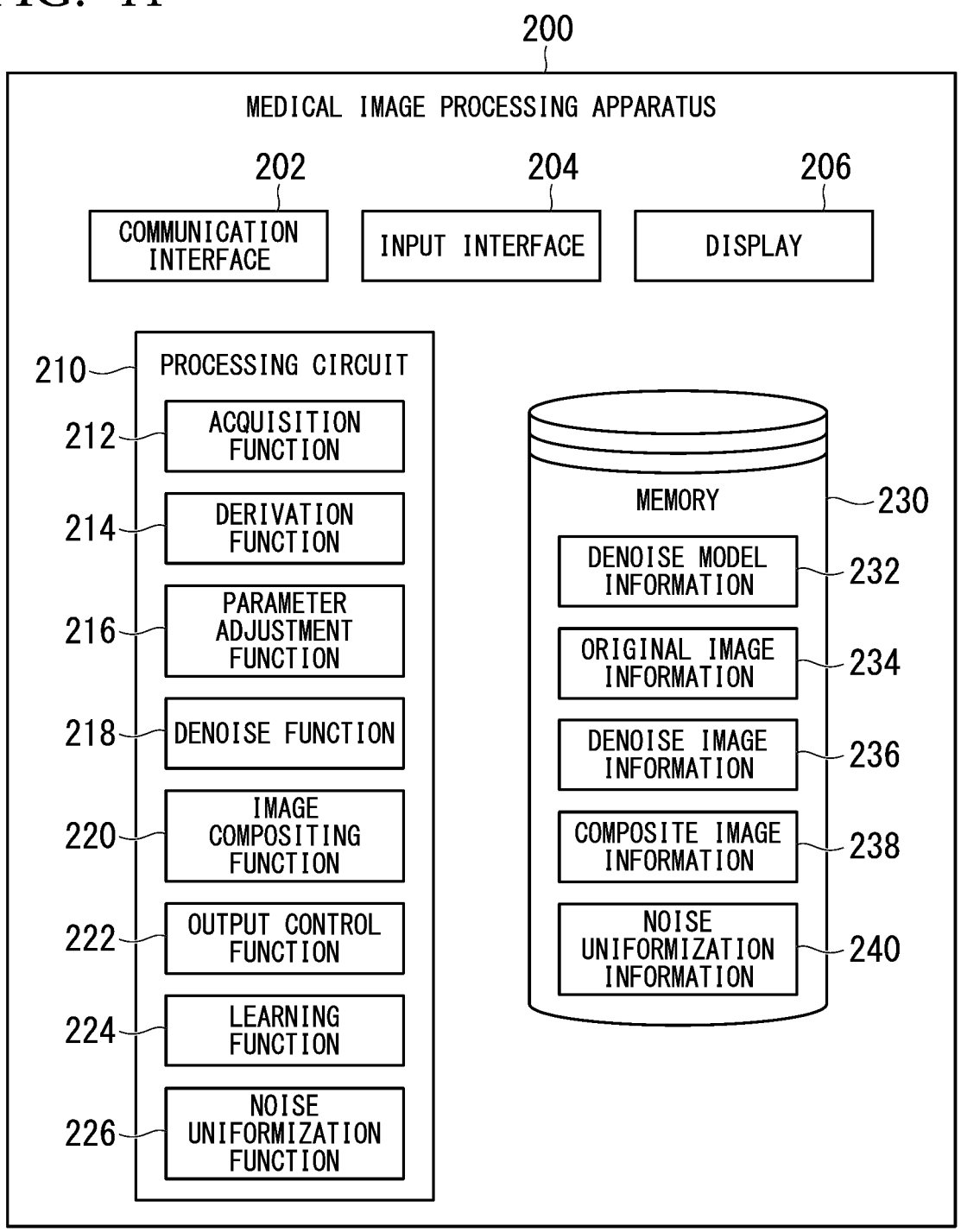
FIG. 11 is a diagram showing an example of a medical image processing apparatus 200 according to a second embodiment.

FIG. 11 is a diagram showing an example of the medical image processing apparatus 200 according to the second embodiment. The processing circuit 210 of the medical image processing apparatus 200 executes a noise uniformization function 226 in addition to the acquisition function 212, the derivation function 214, the parameter adjustment function 216, the denoise function 218, the image compositing function 220, the output control function 222 and the learning function 224. The noise uniformization function 226 is an example of a "uniformization processor."

The noise uniformization function 226 estimates a noise strength distribution from a composite image generated through compositing of original images by the image compositing function 220, generates a noise distribution (hereinafter, uniformization distribution) for uniformizing a noise strength distribution of the composite image from the estimated noise strength distribution and adds a signal represented by the uniformization distribution to the composite image, thereby uniformizing the noise strength distribution included in the composite image. Then, the denoise function 218 performs denoise processing on the composite image having the noise strength distribution uniformized by the noise uniformization function 226.

[Processing Flow (Image Processing)]

Figure 12:
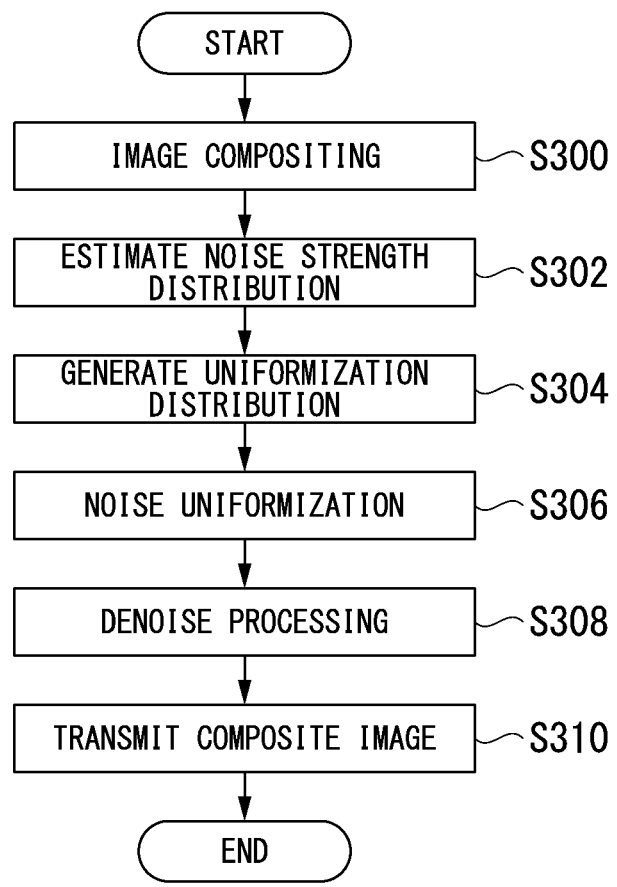
FIG. 12 is a flowchart showing a series of image processing of a processing circuit 210 in the second embodiment.

Next, image processing of the processing circuit 210 will be described. FIG. 12 is a flowchart showing a flow of image processing of the processing circuit 210 in the second embodiment. Processing of this flowchart is performed, for example, when the original images a to h transmitted by the medical image generation apparatus 100 are acquired by the acquisition function 212.

First, the image compositing function 220 generates a composite image through compositing of the original images a to h acquired by the acquisition function 212 (step S300). That is, the image compositing function 220 generates a composite image through compositing of the plurality of original images a to h based on magnetic resonance signals collected from the test object OB through a plurality of reception coils (a plurality of coil elements). When the generation function 134 executed by the processing circuit 130 of the console device 120 of the medical image generation apparatus 100 generates a composite image through compositing of the original images a to h and transmits the composite image to the image compositing function 220, processing of step S300 may not be performed.

Next, the noise uniformization function 226 estimates a noise strength distribution of the composite image generated by the image compositing function 220 (step S302). For example, the noise uniformization function 226 estimates the noise strength distribution of the composite image based on a comparison between the respective original images a to h acquired by the acquisition function 212 and the composite image obtained through compositing of the original images a to h.

Next, the noise uniformization function 226 generates a uniformization distribution for uniformizing the noise strength distribution of the composite image generated by the image compositing function 220 based on the estimated noise strength distribution (step S304). The noise uniformization function 226 may store the generated uniformization distribution in the memory 230 as noise uniformization information. Next, the noise uniformization function 226 uniformizes the noise strength distribution of the composite image by adding the generated uniformization distribution to the composite image generated by the image compositing function 220 (step S306).

Next, the denoise function 218 performs denoise processing of removing noise from the composite image having the noise strength distribution uniformized by the noise uniformization function 226 using the denoise model MDL1 indicated by the denoise model information 232 (step S308).

Next, the output control function 222 controls the communication interface 202 to transmit the composite image on which denoise processing has been performed by the denoise function 218 to the medical image generation apparatus 100 (step S310). The output control function 222 may cause the display 206 to display the composite image. When the communication interface 122 of the medical image generation apparatus 100 receives the composite image from the medical image processing apparatus 200, the display control function 138 of the medical image generation apparatus 100 may cause the display 126 to display the composite image. The output control function 222 may control the communication interface 202 to transmit the composite image to a terminal device that can be used by an image reader.

According to the above-described second embodiment, it is possible to improve the accuracy of denoise processing by performing processing of adding a noise component for uniformizing a noise strength distribution to a composite image generated through compositing of original images and performing denoise processing on the processed composite image.

Modified Example of Second Embodiment

Hereinafter, a modified example of the second embodiment will be described. Although the medical image generation apparatus 100 and the medical image processing apparatus 200 are different apparatuses in the above-described second embodiment, the present invention is not limited thereto. For example, the medical image processing apparatus 200 may be realized by a function of the console device 120 of the medical image generation apparatus 100. That is, the medical image processing apparatus 200 may be a virtual machine virtually realized by the console device 120 of the medical image generation apparatus 100. In this case, the medical image generation apparatus 100 is an example of a "medical information processing apparatus."

Figure 13:
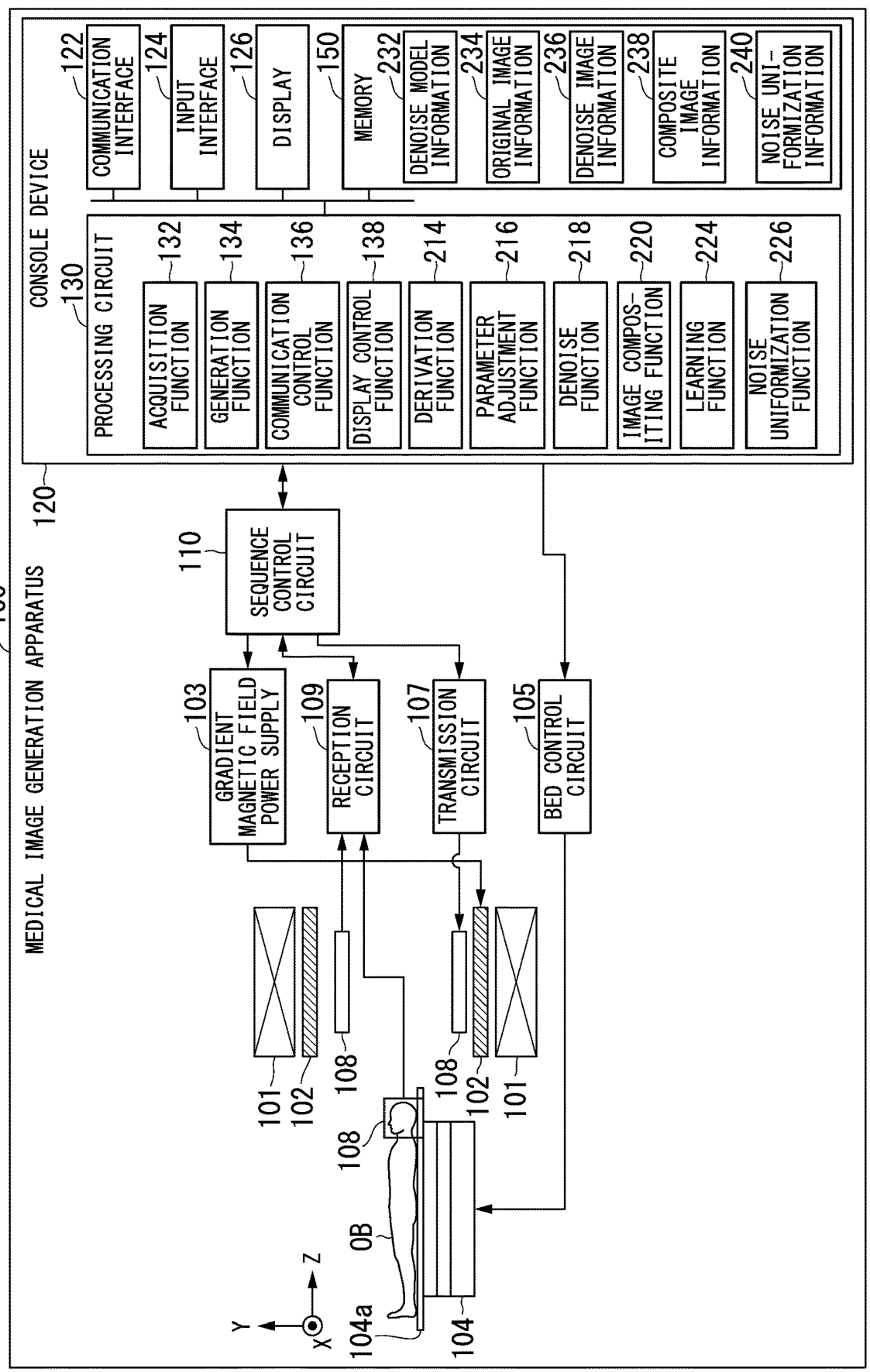
FIG. 13 is a diagram showing a medical image generation apparatus 100 according to a modified example of the second embodiment.

FIG. 13 is a diagram showing a medical image generation apparatus 100 according to the modified example of the second embodiment. As shown in FIG. 13, the processing circuit 130 of the console device 120 may execute the derivation function 214, the parameter adjustment function 216, the denoise function 218, the image compositing function 220, the learning function 224 and the noise uniformization function 226 in addition to the above-described acquisition function 132, generation function 134, communication control function 136 and display control function 138. The denoise model information 232, the original image information 234, the denoise image information 236, the composite image information 238 and the noise uniformization information 240 may be stored in the memory 150 of the console device 120.

According to the above-described modified example of the second embodiment, it is possible to improve the accuracy of denoise processing using only the medical image generation apparatus 100.

Either of the above-described embodiments can be represented as follows.

A medical information processing apparatus including:
a storage which stores a program; and
a processor,
wherein the processor, by executing the program,
derives an index value with respect to noise included in data associated with magnetic resonance signals collected by each of a plurality of reception coils,
adjusts a degree to which noise is removed from the data associated with the magnetic resonance signals based on the derived index value,
removes noise from the data associated with the magnetic resonance signals based on the adjusted degree, and
performs compositing of the data associated with the magnetic resonance signals from which noise has been removed.

Either of the above-described embodiments can be represented as follows.

A medical information processing apparatus including:
a storage which stores a program; and
a processor,
wherein the processor, by executing the program,
generates a composite image through compositing of a plurality of images based on magnetic resonance signals collected from a test object through a plurality of reception coils,
estimates a noise strength distribution included in the generated composite image,
generates a uniformization distribution for uniformizing the estimated noise strength distribution,
uniformizes the noise strength distribution included in the composite image by adding a signal represented by the generated uniformization distribution to the composite image, and
removes noise from the composite image having the uniformized noise strength distribution.

According to at least one of the above-described embodiments, the processing circuit 210 can improve denoise accuracy by including the derivation function 214 which derives an index value with respect to noise included in a plurality of images based on magnetic resonance signals collected from a test object through a plurality of RF coils 108 for each image, the parameter adjustment function 216 which adjusts a degree to which noise is removed from the respective images based on the index value derived by the derivation functions 214, and a denoise function 218 which removes noise from the respective images based on the degree adjusted by the parameter adjustment function 216.

According to at least one of the above-described embodiments, the processing circuit 210 can improve denoise accuracy by including the image compositing function 220 which generates a composite image through compositing of a plurality of images based on magnetic resonance signals collected from a test object through a plurality of RF coils 108, a noise uniformization function 226 which uniformizes a noise strength distribution included in the composite image by estimating a noise strength distribution included in a composite image generated by the image compositing function 220, generating a uniformization distribution for uniformizing the estimated noise strength distribution and adding a signal represented by the generated uniformization distribution to the composite image, and the denoise function 218 which removes noise from the composite image having the noise strength distribution uniformized by the noise uniformization function 226.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A medical information processing apparatus comprising:
processing circuitry configured to
acquire a plurality of images of a test object based on a plurality of magnetic resonance signals collected from the test object by a plurality of reception coils, respectively,
derive a plurality of index values with respect to a plurality of noises included in the plurality of images, respectively,
adjust, based on the plurality of index values, a plurality of degrees to which the plurality of noises are removed from the plurality of images, respectively,
remove, based on the plurality of degrees adjusted, the plurality of noises from the plurality of images, respectively,
composite the plurality of images from which the plurality of noises have been removed, respectively, to generate a composite image, and
output the composite image.

2. A medical information processing apparatus comprising:
processing circuitry configured to
acquire a plurality of images of a test object based on a plurality of magnetic resonance signals collected from the test object by a plurality of reception coils, respectively,
composite the plurality of images to generate a composite image,
estimate a noise strength distribution included in the generated composite image,
generate a uniformization distribution for uniformizing the noise strength distribution,
add a signal represented by the uniformization distribution to the composite image to uniformize the noise strength distribution,
remove a noise from the composite image having the uniformized noise strength distribution, and
output the composite image.

3. A medical information processing method for a computer, comprising:
    acquiring a plurality of images of a test object based on a plurality of magnetic resonance signals collected from the test object by a plurality of reception coils, respectively;
    deriving a plurality of index values with respect to a plurality of noises included in the plurality of images, respectively;
    adjusting, based on the plurality of index values, a plurality of degrees to which the plurality of noises are removed from the plurality of images, respectively;
    removing, based on the plurality of degrees adjusted, the plurality of noises from the plurality of images, respectively;
    compositing the plurality of images from which the plurality of noises have been removed, respectively, to generate a composite image; and
    outputting the composite image.

4. A medical information processing method for a computer, comprising:
    acquiring a plurality of images of a test object based on a plurality of magnetic resonance signals collected from the test object by a plurality of reception coils, respectively;
    compositing the plurality of images to generate a composite image;
    estimating a noise strength distribution included in the composite image;
    generating a uniformization distribution for uniformizing the noise strength distribution;
    adding a signal represented by the uniformization distribution to the composite image to uniformize the noise strength distribution;
    removing a noise from the composite image having the uniformized noise strength distribution; and
    outputting the composite image.

5. A computer-readable non-transitory storage medium storing a program causing a computer to:
    acquire a plurality of images of a test object based on a plurality of magnetic resonance signals collected from the test object by a plurality of reception coils, respectively;
    derive a plurality of index values with respect to a plurality of noises included in the plurality of images, respectively;
    adjust, based on the plurality of index values, a plurality of degrees to which the plurality of noises are removed from the plurality of images, respectively;
    remove, based on the plurality of degrees adjusted, the plurality of noises from the plurality of images, respectively;
    composite the plurality of images from which the plurality of noises has been removed, respectively, to generate a composite image; and
    outputting the composite image.

6. A computer-readable non-transitory storage medium storing a program causing a computer to:
    acquire a plurality of images of a test object based on a plurality of magnetic resonance signals collected from the test object by a plurality of reception coils, respectively;
    composite the plurality of images to generate a composite image;
    estimate a noise strength distribution included in the composite image;
    generate a uniformization distribution for uniformizing the noise strength distribution;
    add a signal represented by the uniformization distribution to the composite image to uniformize the noise strength distribution;
    remove a noise from the composite image having the uniformized noise strength distribution; and
    output the composite image.

7. The medical information processing apparatus according to claim 1, wherein the processing circuitry is further configured to
    derive a plurality of signal-noise ratios of the plurality of images as the plurality of index values, respectively, and
    increase the plurality of degrees as the plurality of signal-noise ratios decrease, respectively, and
    decrease the plurality of degrees as the plurality of signal-noise ratios increase, respectively.

8. The medical information processing apparatus according to claim 1, wherein the processing circuitry is further configured to remove the plurality of noises from the plurality of images, respectively, based on a model trained receive a plurality of input images and output a plurality of output images from which a plurality of noises have been removed, respectively.

9. The medical information processing apparatus according to claim 7, wherein:
    the processing circuitry is further configured to derive the plurality of signal-noise ratios based on a plurality of differences in pixel values between a first set of images of the test object and a second set of images of the test object,
    the first set of images are acquired while the plurality of reception coils generate a plurality of high-frequency magnetic fields, and
    the second set of images are acquired while the plurality of reception coils do not generate the plurality of high-frequency magnetic fields.

10. The medical information processing apparatus according to claim 8, wherein the processing circuitry is further configured to adjust the plurality of degrees by adjusting an internal parameter of the model.

11. The medical information processing apparatus according to claim 10, wherein
    the internal parameter is a parameter of an activation function of at least one node included in the model.

12. The medical information processing apparatus according to claim 7, wherein the processing circuitry is further configured to derive the plurality of signal-noise ratios based on a plurality of differences in pixel values between at least two images of the test object acquired while the plurality of reception coils generate a plurality of high-frequency magnetic fields.

13. The medical information processing apparatus according to claim 12, wherein the at least two images are close to a center slice.

14. The medical information processing apparatus according to claim 2, wherein the processing circuitry is further configured to estimate the noise strength distribution based on a comparison between the plurality of images and the composite image.

15. The medical information processing method according to claim 3, further comprising:
    deriving a plurality of signal-noise ratios of the plurality of images as the plurality of index values, respectively, and increasing the plurality of degrees as the plurality of signal-noise ratios decrease, respectively, and decreasing the plurality of degrees as the plurality of signal-noise ratios increase, respectively, wherein:

deriving the plurality of signal-noise ratios is performed based on a plurality of differences in pixel values between a first set of images of the test object and a second set of images of the test object, the first set of images are acquired while the plurality of reception coils generate a plurality of high-frequency magnetic fields, and the second set of images are acquired while the plurality of reception coils do not generate the plurality of high-frequency magnetic fields.

16. The medical information processing method according to claim 3, further comprising:

deriving a plurality of signal-noise ratios of the plurality of images as the plurality of index values, respectively, and increasing the plurality of degrees as the plurality of signal-noise ratios decrease, respectively, and decreasing the plurality of degrees as the plurality of signal-noise ratios increase, respectively, wherein deriving the plurality of signal-noise ratios is performed based on a plurality of differences in pixel values between at least two images of the test object acquired while the plurality of reception coils generate a plurality of high-frequency magnetic fields.

17. The medical information processing method according to claim 16, wherein the at least two images are close to a center slice.

18. The medical information processing method according to claim 4, wherein estimating the noise strength distribution is performed based on a comparison between the plurality of images and the composite image.

19. The computer-readable non-transitory storage medium according to claim 5, wherein the program further causes the computer to:

derive a plurality of signal-noise ratios of the plurality of images as the plurality of index values, respectively, and increase the plurality of degrees as the plurality of signal-noise ratios decrease, respectively, and decrease the plurality of degrees as the plurality of signal-noise ratios increase, respectively, wherein the plurality of signal-noise ratios are derived based on a plurality of differences in pixel values between a first set of images of the test object and a second set of images of the test object, the first set of images are acquired while the plurality of reception coils generate a plurality of high-frequency magnetic fields, and the second set of images are acquired while the plurality of reception coils do not generate the plurality of high-frequency magnetic fields.

20. The computer-readable non-transitory storage medium according to claim 5, wherein the program further causes the computer to:

derive a plurality of signal-noise ratios of the plurality of images as the plurality of index values, respectively, and increase the plurality of degrees as the plurality of signal-noise ratios decrease, respectively, and decrease the plurality of degrees as the plurality of signal-noise ratios increase, respectively, wherein the plurality of signal-noise ratios are derived based on a plurality of differences in pixel values between at least two images of the test object acquired while the plurality of reception coils generate a plurality of high-frequency magnetic fields.

* * * * *